(12) United States Patent
Choi

(10) Patent No.: US 10,581,392 B2
(45) Date of Patent: Mar. 3, 2020

(54) POWER AMPLIFYING DEVICE

(71) Applicant: Samsung Electro-Mechanics Co., Ltd., Suwon-si (KR)

(72) Inventor: Kyu Jin Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/030,089

(22) Filed: Jul. 9, 2018

(65) Prior Publication Data

US 2019/0115881 A1    Apr. 18, 2019

(30) Foreign Application Priority Data

Oct. 17, 2017    (KR) .......................... 10-2017-0134508

(51) Int. Cl.
*H03F 3/191*    (2006.01)
*H03F 3/21*    (2006.01)
(Continued)

(52) U.S. Cl.
CPC .............. *H03F 3/211* (2013.01); *H03F 1/32* (2013.01); *H03F 1/56* (2013.01); *H03F 3/19* (2013.01); *H03F 2200/111* (2013.01); *H03F 2200/171* (2013.01); *H03F 2200/267* (2013.01); *H03F 2200/336* (2013.01); *H03F 2200/399* (2013.01); *H03F 2200/451* (2013.01); *H03F 2201/3206* (2013.01); *H03F 2203/21139* (2013.01); *H03F 2203/21157* (2013.01); *H03F 2203/21169* (2013.01)

(58) Field of Classification Search
CPC ... H03F 3/211; H03F 3/19; H03F 1/32; H03F 1/56; H03F 3/191; H03F 3/193

USPC ................................ 330/296, 302, 285, 133
See application file for complete search history.

(56) References Cited

U.S. PATENT DOCUMENTS 8,515,364 B2 *  8/2013  Oliaei ...................... H03F 3/16
                                                              455/114.1
2014/0051374 A1   2/2014  Oliaei
                         (Continued)

FOREIGN PATENT DOCUMENTS

KR         2002-0061727 A        7/2002

OTHER PUBLICATIONS

Korean Office Action dated Sep. 20, 2018 in corresponding Korean Patent Application No. 10-2017-0134508 (5 pages in English, 4 pages in Korean).

*Primary Examiner* — Khanh V Nguyen
*Assistant Examiner* — Khiem D Nguyen
(74) *Attorney, Agent, or Firm* — NSIP Law

(57) ABSTRACT

A power amplifying device includes a first amplification circuit amplifying a first signal having a first frequency component and a second frequency component; a second amplification circuit amplifying a second signal received through an output node of the first amplification circuit; a filter circuit connected between a ground node of the first amplification circuit and a common ground to pass the first and second frequency components to the common ground through the ground node; and an inverting circuit that phase-inverts a signal including second harmonic components of the first and second frequency components that are received through the ground node of the first amplification circuit and provide the phase inverted signal to the output node of the first amplification circuit.

21 Claims, 7 Drawing Sheets

(51) Int. Cl.
*H03F 1/56* (2006.01)
*H03F 1/32* (2006.01)
*H03F 3/19* (2006.01)

(56) References Cited

U.S. PATENT DOCUMENTS

2016/0013758 A1 1/2016 Cao et al.
2017/0040958 A1 2/2017 Cao et al.

* cited by examiner

POWER AMPLIFYING DEVICE

CROSS-REFERENCE TO RELATED APPLICATION(S)

This application claims the benefit under 35 USC 119(a) of Korean Patent Application No. 10-2017-0134508 filed on Oct. 17, 2017 in the Korean Intellectual Property Office, the entire disclosure of which is incorporated herein by reference for all purposes.

BACKGROUND

1. Field

The present disclosure relates to a power amplifying device such as a power amplifier device.

2. Description of Related Art

In general, as the demand for broadband, multimedia and smart technology in wireless communication systems gradually increases, broadband, improvements in linearity, and the implementation of smart technology in radio frequency (RF) power amplifiers (PA) applied to the wireless communications system has increased.

Since RF power amplifiers are required to operate linearly in a higher power region, linearity should be ensured without distortion for wideband signals including a plurality of frequency bands.

However, according to the typical RF power amplifier, in a case in which an interval between fundamental frequency components of two or more different bands is relatively narrow, since a third-order intermodulation distortion (IM3) component and a second harmonic component due to different frequency components are adjacent to the fundamental frequency component, there is a problem in that distortion characteristics may be deteriorated.

SUMMARY

This Summary is provided to introduce a selection of concepts in a simplified form that are further discussed below in the Detailed Description. This Summary is not intended to identify key features of the claimed subject matter, nor is this Summary intended to be used as an aid in determining the scope of the claimed subject matter.

In one general aspect, a power amplifying device includes a first amplification circuit configured to amplify a first signal having a first frequency component and a second frequency component; a second amplification circuit configured to amplify a second signal received through an output node of the first amplification circuit; a filter circuit connected between a ground node of the first amplification circuit and a common ground to pass the first frequency component and the second frequency component to the common ground through the ground node; and an inverting circuit configured to phase-invert a signal that includes second harmonic components of the first frequency component and the second frequency component received through the ground node of the first amplification circuit and provide the phase inverted signal to the output node of the first amplification circuit.

The inverting circuit may be configured to attenuate the second harmonic components of the first frequency component and the second frequency component output through the output node of the first amplification circuit.

The filter circuit may include at least one or more inductor elements and at least one or more capacitor elements to generate a first impedance which is low with respect to the first frequency component and the second frequency component, and to generate a second impedance which is higher than the first impedance with respect to the second harmonic components of the first frequency component and the second frequency component.

The filter circuit may be a parallel resonance circuit comprising an inductor element and a capacitor element connected to each other in parallel.

The parallel resonance circuit may have a resonance frequency corresponding to any one frequency component of the second harmonic components of the first frequency component and the second frequency component.

The parallel resonance circuit may have a resonance frequency corresponding to a frequency component in a range of frequencies between the second harmonic components of the first frequency component and the second frequency component.

The inverting circuit may be configured to generate third-order intermodulation distortion signals which are phase inverted for the first frequency component and the second frequency component and provide the generated third-order intermodulation distortion signals to the output node of the first amplification circuit, and attenuate the third-order intermodulation distortion signals of the first frequency component and the second frequency component output from the output node of the first amplification circuit.

The inverting circuit may include an inverting amplifier configured to phase-invert the signal including the second harmonic components of the first frequency component and the second frequency component, and generate phase inverted third-order intermodulation distortion signals for the first frequency component and the second frequency component.

According to another general aspect, a power amplifying device includes a first amplification circuit configured to amplify a signal having a first frequency component and a second frequency component; a second amplification circuit configured to amplify a signal received through an output node of the first amplification circuit; a resonance circuit connected between a ground node of the first amplification circuit and a common ground to pass the first frequency component and the second frequency component to the ground through the ground node; and an inverting amplification circuit configured to phase-invert a signal including second harmonic components of the first frequency component and the second frequency component received through the ground node of the first amplification circuit and provide the phase inverted second harmonic components to an output node of the first amplification circuit, and configured to generate phase inverted third-order intermodulation distortion signals for the first frequency component and the second frequency component and provide the phase inverted third-order intermodulation distortion signals to the output node of the first amplification circuit.

The inverting amplification circuit may be configured to attenuate the second harmonic components of the first frequency component and the second frequency component and the third-order intermodulation distortion signals which are output through the output node of the first amplification circuit.

The resonance circuit may include at least one inductor element and at least one capacitor element to generate a first impedance which is low with respect to the first frequency component and the second frequency component, and to generate a second impedance which is higher than the first impedance with respect to the second harmonic components of the first frequency component and the second frequency component.

The resonance circuit may be a parallel resonance circuit comprising an inductor element and a capacitor element connected to each other in parallel.

The parallel resonance circuit may have a resonance frequency corresponding to any one frequency component of the second harmonic components of the first frequency component and the second frequency component, The parallel resonance circuit may have a resonance frequency corresponding to a frequency component in a range of frequencies between the second harmonic components of the first frequency component and the second frequency component.

According to another general aspect, a power amplifying device includes a first amplification circuit configured to amplify a first signal having a first frequency component and a second frequency component, and generate second harmonic components of the first frequency component and the second frequency component and third-order intermodulation distortion components of the first frequency component and the second frequency component; a second amplification circuit configured to amplify a second signal received through an output node of the first amplification circuit; a filter circuit connected between a ground node of the first amplification circuit and a common ground, and configured to pass the first frequency component and the second frequency component to the common ground; and an inverting circuit connected to the output node of the first amplification circuit and the ground node, and configured to phase-invert a signal received from the ground node that includes second harmonic components of the first frequency component and the second frequency component.

The second signal received through the output node of the first amplification circuit may include the second harmonic components of the first frequency component and the second frequency component, and the third-order intermodulation distortion components.

The inverting circuit may receive second harmonic components and third-order intermodulation distortion components from the ground node of the first amplification circuit, and phase-inverts the received second harmonic components and third-order intermodulation distortion components.

The inverting circuit may be configured to provide the phase-inverted second harmonic components and the phase-inverted third-order intermodulation distortion components to the output node of the first amplification circuit and attenuate the second harmonic components and the third-order intermodulation distortion components output through the output node of the first amplification circuit.

The filter circuit may have a resonance frequency corresponding to any one frequency component of the second harmonic components of the first frequency component and the second frequency component.

The filter circuit may have a resonance frequency corresponding to a frequency component in a range of frequencies between the second harmonic components of the first frequency component and the second frequency component.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
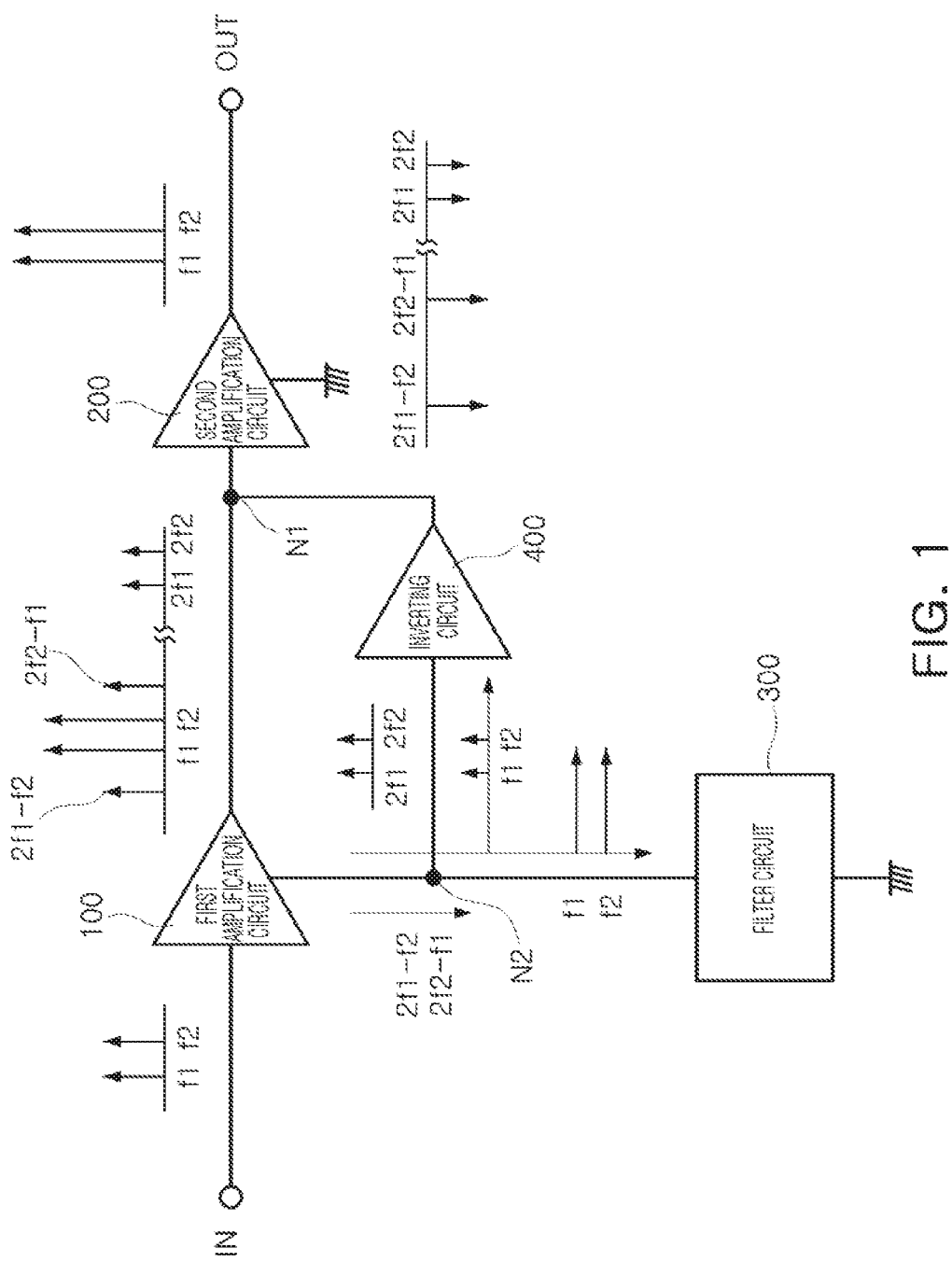
FIG. 1 is a block diagram illustrating an example of a power amplifying device according to the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram illustrating an example of a power amplifying device according to the present disclosure.

Referring to FIG. 1, a power amplifying device according to the present disclosure may include a first amplification circuit 100, a second amplification circuit 200, a filter circuit 300, and an inverting circuit 400, for example.

The first amplification circuit 100 may amplify a first signal having a first frequency component f1 and a second frequency component f2.

For example, the first frequency component f1 may be a central frequency component of a first band and may be, for example, 895 MHz. The second frequency component f2 may be a central frequency component of a second band adjacent to the first band and may be, for example, 900 MHz. Here, while the first amplification circuit 100 amplifies the first signal, the first amplification circuit 100 may also generate second harmonic components 2f1 and 2f2, and third-order intermodulation distortion components 2f1-f2 and 2f2-f1 of the respective first frequency component f1 and the second frequency component f2 due to non-linear characteristics thereof.

The second amplification circuit 200 amplifies a second signal received through an output node N1 of the first amplification circuit 100 and output the amplified second signal through an output terminal OUT of the second amplification circuit 200.

The filter circuit 300 may be connected between a ground node N2 of the first amplification circuit 100 and a common ground to pass the first and second frequency components f1 and f2 through the ground node N2.

In order to operate the first amplification circuit 100, the first amplification circuit 100 may be supplied with an operation voltage through a source voltage terminal, and while the first amplification circuit 100 operates, a current signal flows through the ground node N2. Here, the current signal flowing through the ground node N2 of the first amplification circuit 100 may include the first and second frequency components f1 and f2, and may also include the second harmonic components 2f1 and 2f2 of the first frequency component f1 and the second frequency component f2.

In addition, the filter circuit 300 includes at least one inductor element L31 (FIG. 2) and at least one capacitor element C31 (FIG. 2) to generate a first impedance Z1, which is low with respect to the first and second frequency components f1 and f2, and generate a second impedance Z2, which is higher than the first impedance Z1 with respect to the second harmonic components 2f1 and 2f2 of the first and second frequency components f1 and f2. Thus, the filter circuit has a low impedance with respect to the first and second frequency components f1 and f2, and a high impedance with respect to the second harmonic components 2f1 and 2f2.

Accordingly, the second harmonic components 2f1 and 2f2 may be input to the inverting circuit 400 without passing through the filter circuit 300 due to the relatively high impedance of the filter circuit 300.

On the other hand, the first and second frequency components f1 and f2 may be passed to a common ground through the filter circuit 300 due to the relatively low impedance of the filter circuit 300 with respect to the first and second frequency components f1 and f2.

That is, as illustrated in FIG. 1, since most of the first and second frequency components f1 and f2 are passed to the common ground by the filter circuit 300, the first and second frequency components f1 and f2 may not be input to the inverting circuit 400, or only a very small portion of the first and second frequency components f1 and f2 may be input to the inverting circuit 400.

In addition, the inverting circuit 400 phase-inverts a signal including the second harmonic components 2f1 and 2f2 of the first and second frequency components f1 and f2 that is received through the ground node N2 of the first amplification circuit 100 and provides the phase-inverted signal to the output node N1 of the first amplification circuit 100.

Accordingly, at the output node N1 of the first amplification circuit 100, the second harmonic components 2f1 and 2f2 of the respective first and second frequency components f1 and f2 is attenuated by the second harmonic components 2f1 and 2f2, which are phase-inverted by the inverting circuit 400.

As an example, the inverting circuit 400 includes an inverting amplifier. The inverting amplifier of the inverting circuit 400 phase-inverts the signal including the second harmonic components 2f1 and 2f2 of the respective first and second frequency components f1 and f2, and provide the phase inverted second harmonic components −2f1 and 2f2 to the output node N1 of the first amplification circuit 100. The inverting amplifier of the inverting circuit 400 also generates phase inverted third-order intermodulation distortion (IM3) signals −(2f1-f2) and −(2f2-f1) for the respective first and second frequency components f1 and f2 and provide the phase inverted IM3 signals to the output node N1 of the first amplification circuit 100.

Accordingly, at the output node N1 of the first amplification circuit 100, the second harmonic components 2f1 and 2f2 and the third-order intermodulation distortion components 2f1-f2 and 2f2-f1 included in the signal output from the first amplification circuit 100 is attenuated by the second harmonic components −2f1 and 2f2 which are phase inverted by the inverting circuit 400 and the phase inverted third-order intermodulation distortion (IM3) signals −(2f1-f2) and −(2f2-f1).

In this case, if amplitudes of the phase inverted second harmonic components −2f1 and 2f2 and the phase inverted third-order intermodulation distortion (IM3) signals −2(2f1-f2) and −(2f2-f1) are appropriately adjusted through a gain of the inverting amplifier, the second harmonic components 2f1 and 2f2 and the third-order intermodulation components 2f1-f2 and 2f2-f1 output from the first amplification circuit 100 may be significantly attenuated.

Figure 2:
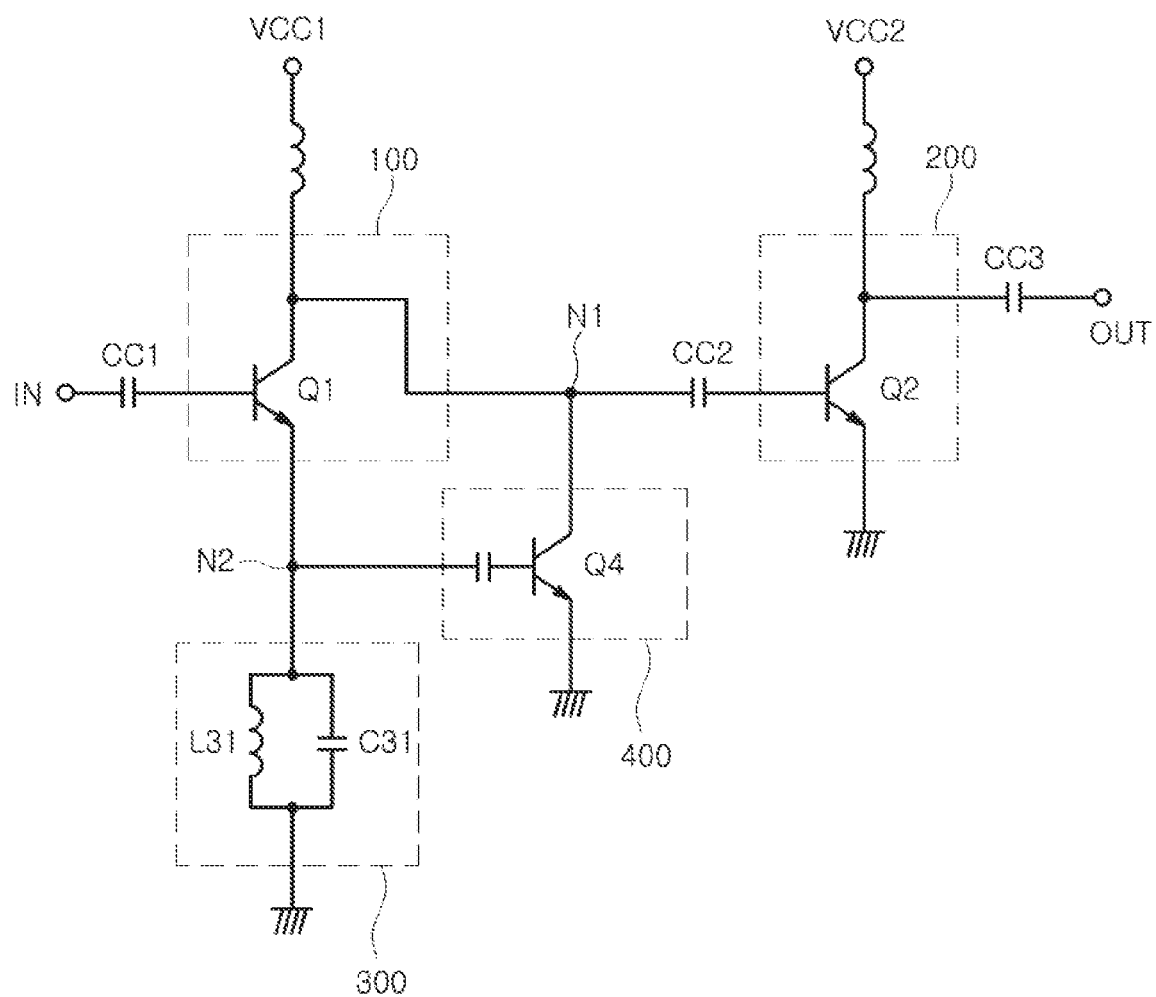
FIG. 2 is an example of a circuit block diagram illustrating a power amplifying device according to the present disclosure.

FIG. 2 is a circuit block diagram illustrating an example of a power amplifying device according to the present disclosure.

Referring to FIG. 2, the first amplification circuit 100 includes a first transistor Q1 having a base connected to an input terminal IN through a first coupling capacitor CC1, a collector connected to an output node N1 and also connected to a first source voltage (VCC1) terminal through a coil, and an emitter connected to the filter circuit 300 through the ground node N2.

The second amplification circuit 200 includes a second transistor Q2 having a base connected to the output node N1 of the first amplification circuit 100 through a second coupling capacitor CC2, a collector connected to a second source voltage (VCC2) terminal through a coil and also connected to an output terminal OUT through a third coupling capacitor CC3, and an emitter connected to a ground.

As an example, the first transistor Q1 and the second transistor Q2 may be bipolar junction transistors (BJT), but is not limited thereto, and the first, second, and third coupling capacitors CC1, CC2, and CC3 may be capacitors that pass an alternating current (AC) signal and block a direct current (DC) component. The coils connected to the first source voltage (VCC1) terminal and the second source voltage (VCC2) terminal may pass an AC voltage and block AC components included in the first source voltage VCC1 and the second source voltage VCC2.

The filter circuit 300 includes a parallel resonance circuit L31 and C31 including an inductor element L31 and a capacitor element C31 which are connected to each other in parallel.

As an example, the parallel resonance circuit L31 and C31 may have a resonance frequency corresponding to any one frequency component of the second harmonic components 2f1 and 2f2 of the first and second frequency components f1 and f2 or any frequency component in a range of frequencies between the second harmonic components 2f1 and 2f2 of the first and second frequency components f1 and f2.

As an example, in a case in which the first and second frequency components f1 and f2 are 895 MHz and 900 MHz, respectively, the resonance frequency may be 1.79 GHz or 1.8 GHz, or any one frequency between 1.79 GHz to 1.8 GHz.

The inverting circuit 400 includes a third transistor Q4 having a base connected to the ground node N2 through a coupling capacitor, a collector connected to the output node N1 of the first amplification circuit 100, and an emitter connected to a common ground.

As an example, the third transistor Q4 may be a bipolar junction transistor (BJT), and phase-inverts the first and second frequency components f1 and f2 which are input to the base of the transistor Q4 to allow the phase inverted third-order intermodulation distortion (IM3) signal to flow from the output node N1 to the ground through the collector and the emitter.

Accordingly, the second harmonic components 2f1 and 2f2 of the first and second frequency components f1 and f2 and the third-order intermodulation distortion (IM3) signal of the first and second frequency components f1 and f2 which are output through the output node N1 of the first amplification circuit 100 is attenuated.

Figure 3:
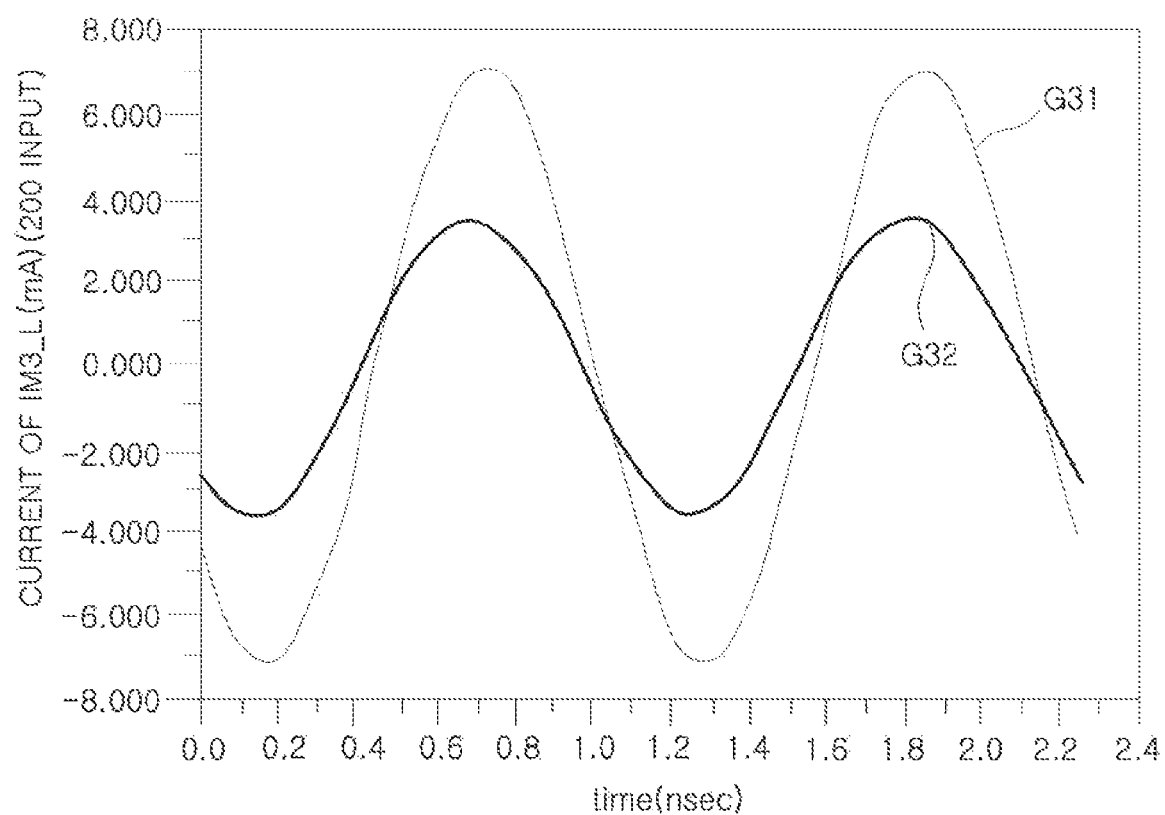
FIG. 3 is an example of a characteristic view of a current of a lower third-order intermodulation distortion (IM3_L) at an input node of a second amplification circuit according to the present disclosure.

FIG. 3 is an example of a characteristic view of a current of a lower third-order intermodulation distortion (IM3_L) at an input node of a second amplification circuit 200 (FIG. 1) according to the present disclosure.

In FIG. 3, a vertical axis denotes a lower third-order intermodulation distortion (IM3_L) 2f1-f2 current (mA) at an input node of the second amplification circuit 200 (FIG. 1) and a horizontal axis denotes a time (nsec).

In FIG. 3, for a case in which the first and second frequency components f1 and f2 are 895 MHz and 900 MHz, G31 denotes the related art lower third-order intermodulation distortion (IM3_L) current (mA) and G32 denotes a lower third-order intermodulation distortion (IM3_L) current (mA) according to the present disclosure.

It may be seen from G31 and G32 illustrated in FIG. 3 that amplitude of lower third-order intermodulation distortion (IM3_L) current at the input node of the second amplification circuit 200 (FIG. 1) according to the present disclosure is reduced as compared to amplitude of the lower third-order intermodulation distortion (IM3_L) current at the input node of the related art second amplification circuit.

Figure 4:
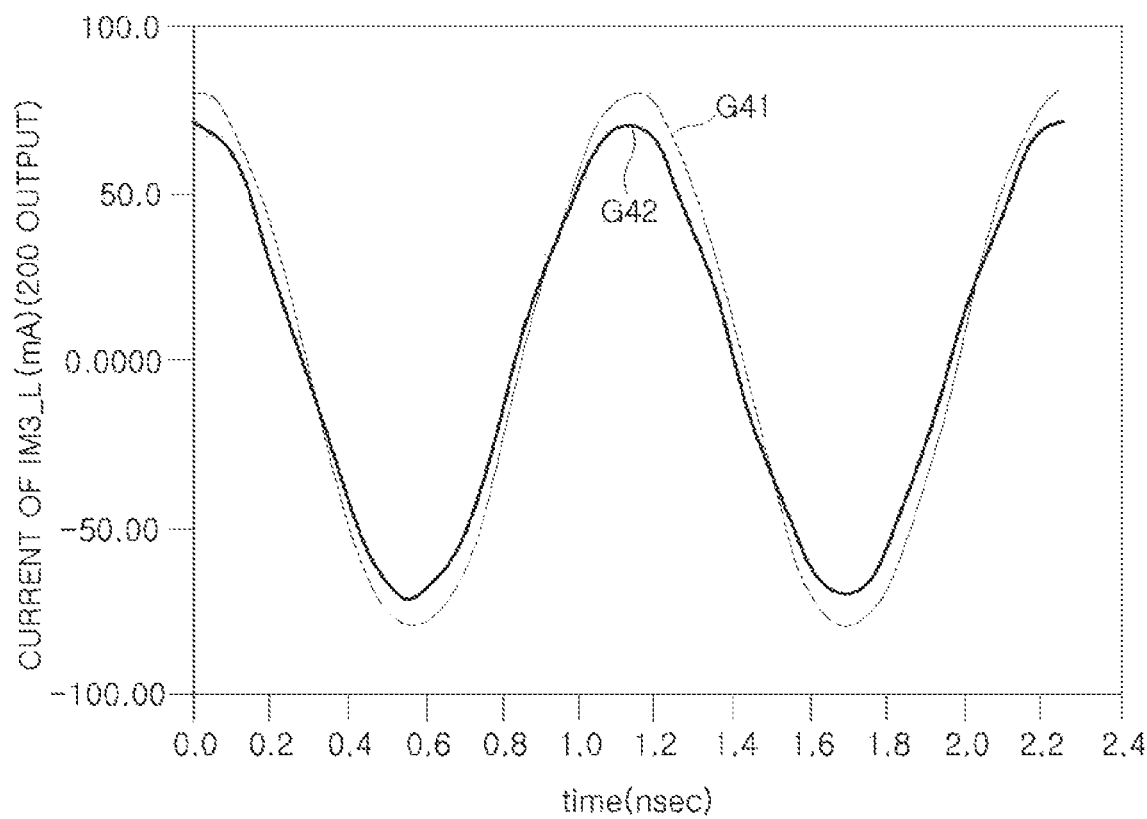
FIG. 4 is an example of a characteristic view of a current of a lower third-order intermodulation distortion (IM3_L) at an output node of the second amplification circuit according to the present disclosure.

FIG. 4 is an example of a characteristic view of a current of a lower third-order intermodulation distortion (IM3_L) at an output node of the second amplification circuit 200 (FIG. 1) according to the present disclosure.

In FIG. 4, a vertical axis denotes a lower third-order intermodulation distortion (IM3_L) 2f1-f2 current (mA) at an output node of the second amplification circuit 200 (FIG. 1) and a horizontal axis denotes a time (nsec).

In FIG. 4, for a case in which the first and second frequency components f1 and f2 are 895 MHz and 900 MHz, respectively, G41 denotes the related art lower third-order intermodulation distortion (IM3_L) current (mA) and G42 denotes a lower third-order intermodulation distortion (IM3_L) current (mA) according to the present disclosure. In FIG. 4, the first and second frequency components f1 and f2 may be fundamental waves of a first band and a second band.

It may be seen from G41 and G42 illustrated in FIG. 4 that the amplitude of a lower third-order intermodulation distortion (IM3_L) current at the input node of the second amplification circuit 200 (FIG. 1) according to the present disclosure is reduced as compared to amplitude of the lower third-order intermodulation distortion (IM3_L) current at the output node of the related art second amplification circuit.

Figure 5:
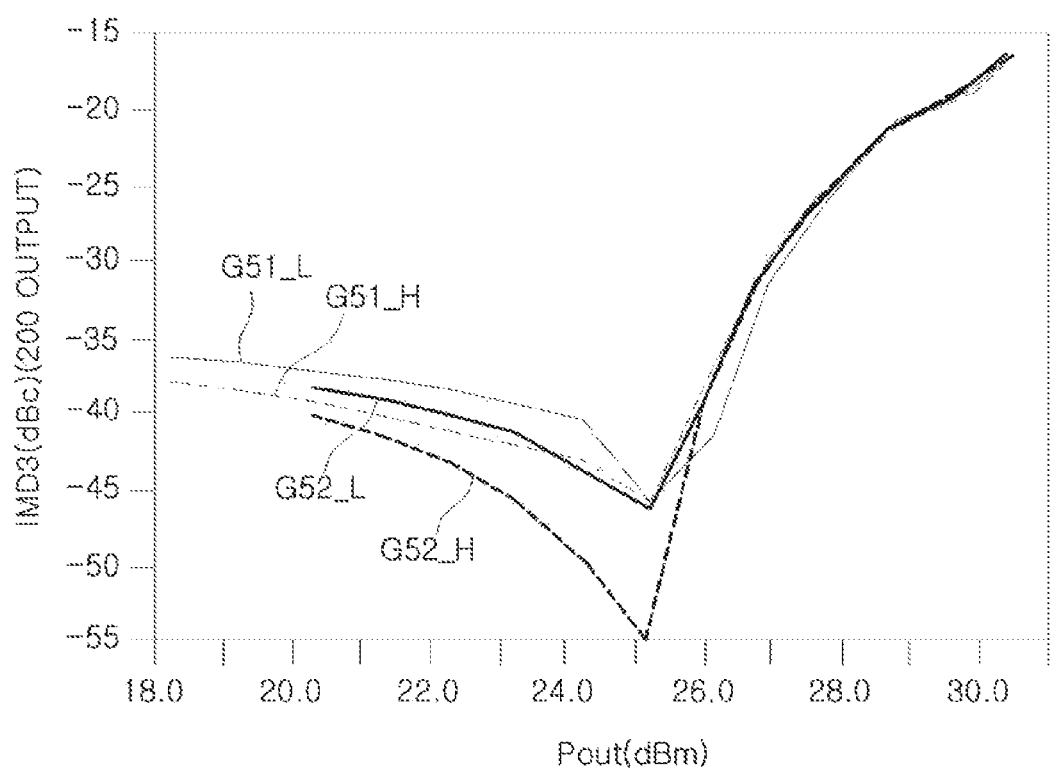
FIG. 5 is an example of a power characteristic view of a lower third-order IMD (IMD3) at the output node of the second amplification circuit according to the present disclosure.

FIG. 5 is a power characteristic view of a third-order IMD (IMD3) component at the output node of the second amplification circuit 200 (FIG. 1) according to the present disclosure.

In FIG. 5, a vertical axis denotes power magnitude of third-order IMD (IMD3) components at the output node of the second amplification circuit 200 (FIG. 1) and a horizontal axis denotes output power magnitude (dBc) of the second amplification circuit 200 (FIG. 1) for the first and second frequency components f1 and f2.

In FIG. 5, G51_L and G51_H denote power magnitudes (dBc) IMD3_low and IMD3_High of lower and upper third-order IMD (IMD3), respectively, at the output node of the related art second amplification circuit, and G52_L and G52_H denote power magnitudes (dBc) of lower and upper third-order IMD (IMD3), respectively, at the output node of the second amplification circuit 200 (FIG. 1) according to the present disclosure. In FIG. 5, the third-order IMD (IMD3) means a power magnitude difference between the fundamental wave and the third-order intermodulation distortion (IM3) component.

Comparing G51_L and G52_L, and G51_H and G52_H illustrated in FIG. 5 with each other, it may be seen that the power magnitude (dBc) of the third-order IMD (IMD3) at the output node of the second amplification circuit 200 (FIG. 1) is reduced as compared to the fundamental wave.

Figure 6:
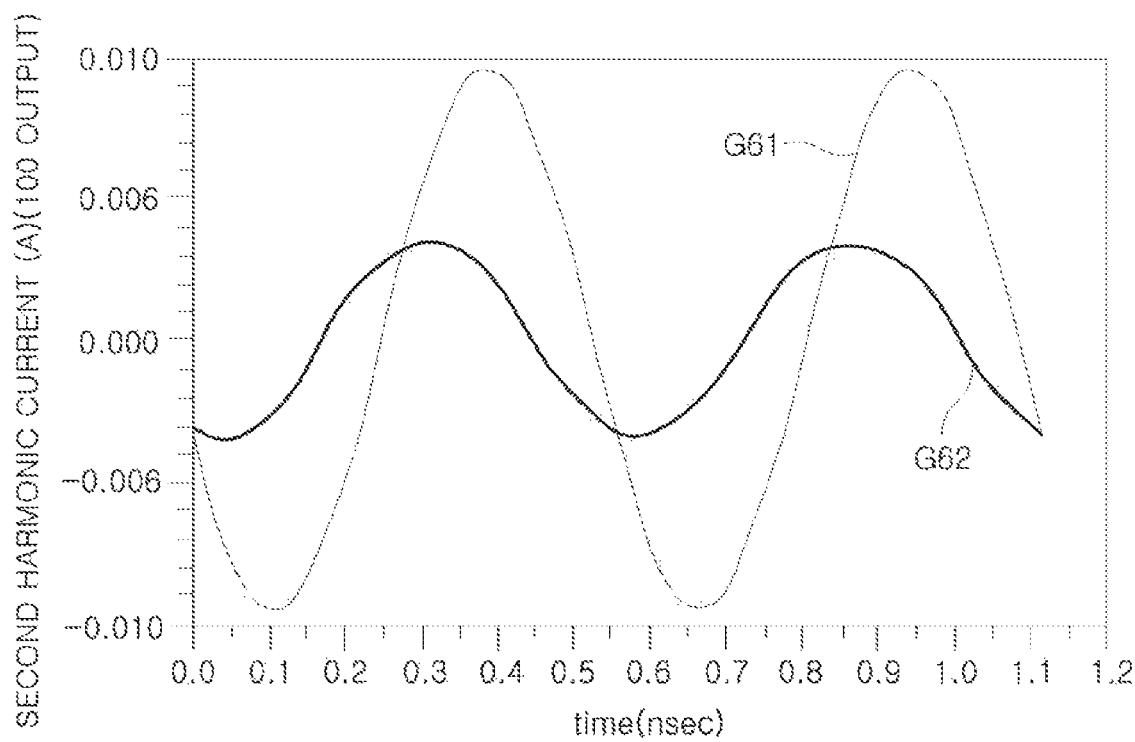
FIG. 6 is an example of a characteristic view of a second harmonic current at an output node of a first amplification circuit according to the present disclosure.

FIG. 6 is an example of a characteristic view of a second harmonic current at an output node of a first amplification circuit 100 (FIG. 1) according to the present disclosure.

In FIG. 6, a vertical axis denotes amplitude A of a second harmonic current at an output node of the first amplification circuit 100 (FIG. 1) and a horizontal axis denotes a time (nsec).

In FIG. 6, G61 is a waveform diagram illustrating a second harmonic current at an output node of the related art first amplification circuit and G62 is a waveform diagram illustrating a second harmonic current at the output node of the first amplification circuit 100 (FIG. 1) according to the present disclosure.

Referring to waveform G61 and waveform G62 of FIG. 6, it may be seen that the amplitude of the second harmonic current at the output node of the first amplification circuit 100 (FIG. 1) according to the present disclosure is reduced as compared to a fundamental wave.

Figure 7:
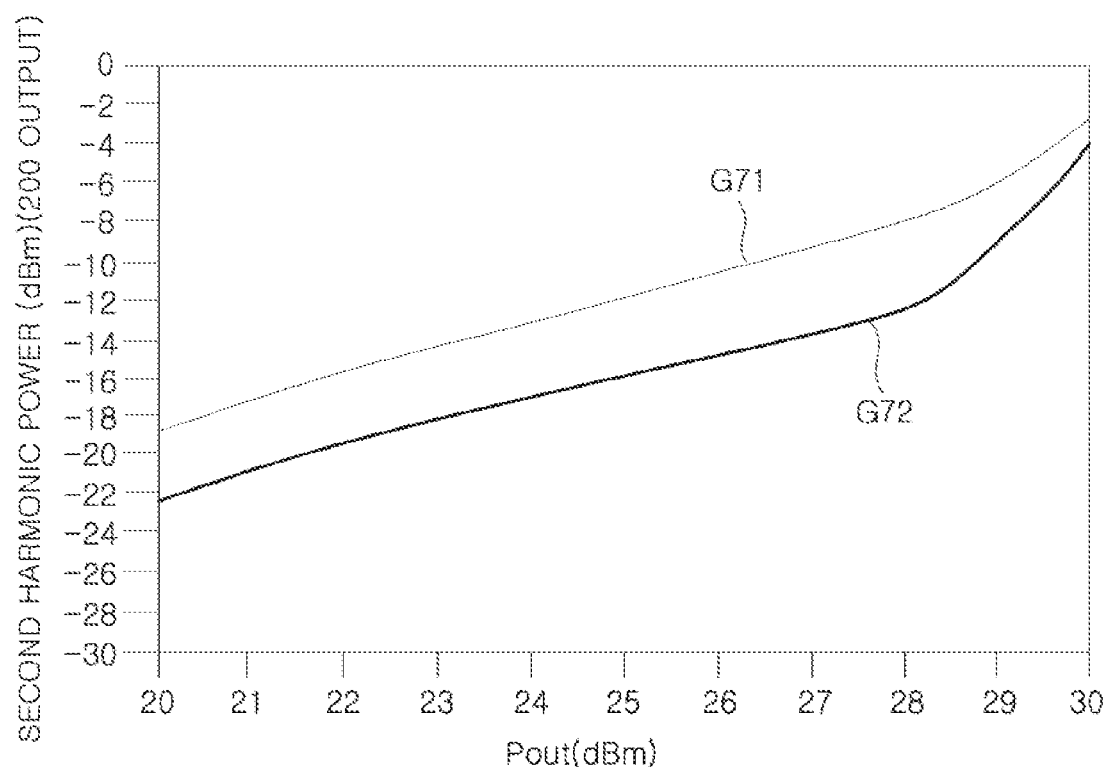
FIG. 7 is an example of a characteristic view of a second harmonic power at an output node of a second amplification circuit according to the present disclosure.

FIG. 7 is an example of a characteristic view of a second harmonic power at an output node of a second amplification circuit 200 (FIG. 1) according to the present disclosure.

In FIG. 7, a vertical axis denotes a magnitude (dBm) of a second harmonic power at the output node of the second amplification circuit 200 (FIG. 1) and the horizontal axis denotes a magnitude (dBm) of power at the output node of the second amplification circuit 200 (FIG. 1) for the first and second frequency components f1 and f2.

In FIG. 7, G71 denotes a magnitude of the second harmonic power at the output node of the conventional second amplification circuit and G72 denotes a magnitude (dBm) of the second harmonic power at the output node of the second amplification circuit according to the present disclosure.

Referring to waveform G71 and waveform G72 of FIG. 7, it may be seen that the magnitude (dBm) of the second harmonic power at the output node of the second amplification circuit 200 (FIG. 1) according to the present disclosure is reduced as compared to a fundamental wave.

As described above, since the power amplifying device may reduce all of the second harmonic component, the third-order IMD (IMD3), and the adjacent channel leakage ratio (ACLR), and may be implemented in an on-chip using a relatively small filter circuit and transistor, the power amplifying device may have an advantage that there is no additional cost or area consumption in the module.

As set forth above, according to the present disclosure, the power amplifying device may improve distortion characteristics such as harmonic, third-order intermodulation distortion (IM3), and the like, and adjacent channel leakage ratio (ACLR) characteristics, and may be implemented in an on-chip at the integrated circuit level.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifying device comprising:
a first amplification circuit configured to amplify a first signal having a first frequency component and a second frequency component;
a second amplification circuit configured to amplify a second signal received through an output node of the first amplification circuit;
a filter circuit connected between a ground node of the first amplification circuit and a common ground, and configured to pass the first frequency component and the second frequency component to the common ground through the ground node; and
an inverting circuit configured to phase-invert a signal that includes second harmonic components of the first frequency component and the second frequency component received through the ground node of the first amplification circuit and provide the phase inverted signal to the output node of the first amplification circuit.

2. The power amplifying device of claim 1, wherein the inverting circuit is configured to attenuate the second harmonic components of the first frequency component and the second frequency component output through the output node of the first amplification circuit.

3. The power amplifying device of claim 1, wherein the filter circuit comprises at least one inductor element and at least one capacitor element configured to generate a first impedance that is low with respect to the first frequency component and the second frequency component, and generate a second impedance that is higher than the first impedance with respect to the second harmonic components of the first frequency component and the second frequency component.

4. The power amplifying device of claim 1, wherein the filter circuit is a parallel resonance circuit comprising an inductor element and a capacitor element connected to each other in parallel.

5. The power amplifying device of claim 4, wherein the parallel resonance circuit has a resonance frequency corresponding to any one frequency component of the second harmonic components of the first frequency component and the second frequency component.

6. The power amplifying device of claim 4, wherein the parallel resonance circuit has a resonance frequency corresponding to a frequency component between the second harmonic components of the first frequency component and the second frequency component.

7. The power amplifying device of claim 1, wherein the inverting circuit is configured to generate third-order intermodulation distortion signals which are phase inverted for the first frequency component and the second frequency component, provide the generated third-order intermodulation distortion signals to the output node of the first amplification circuit, and attenuate the third-order intermodulation distortion signals of the first frequency component and the second frequency component output from the output node of the first amplification circuit.

8. The power amplifying device of claim 1, wherein the inverting circuit comprises an inverting amplifier configured to phase-invert the signal including the second harmonic components of the first frequency component and the second frequency component, and generate phase inverted third-order intermodulation distortion signals for the first frequency component and the second frequency component.

9. A power amplifying device comprising:
a first amplification circuit configured to amplify a signal having a first frequency component and a second frequency component;
a second amplification circuit configured to amplify a signal received through an output node of the first amplification circuit;
a resonance circuit connected between a ground node of the first amplification circuit and a common ground to pass the first frequency component and the second frequency component to the ground through the ground node; and
an inverting amplification circuit configured to phase-invert a signal including second harmonic components of the first frequency component and the second frequency component received through the ground node of the first amplification circuit and provide the phase inverted second harmonic components to an output node of the first amplification circuit, and configured to generate phase inverted third-order intermodulation distortion signals for the first frequency component and the second frequency component and provide the phase inverted third-order intermodulation distortion signals to the output node of the first amplification circuit.

10. The power amplifying device of claim 9, wherein the inverting amplification circuit is configured to attenuate the second harmonic components of the first frequency component and the second frequency component and the third-order intermodulation distortion signals which are output through the output node of the first amplification circuit.

11. The power amplifying device of claim 9, wherein the resonance circuit comprises at least one inductor element and at least one capacitor element to generate a first impedance which is low with respect to the first frequency component and the second frequency component, and to generate a second impedance which is higher than the first impedance with respect to the second harmonic components of the first frequency component and the second frequency component.

12. The power amplifying device of claim 9, wherein the resonance circuit is a parallel resonance circuit comprising an inductor element and a capacitor element connected to each other in parallel.

13. The power amplifying device of claim 12, wherein the parallel resonance circuit has a resonance frequency corresponding to any one frequency component of the second harmonic components of the first frequency component and the second frequency component.

14. The power amplifying device of claim 12, wherein the parallel resonance circuit has a resonance frequency corresponding to a frequency component in a range of frequencies between the second harmonic components of the first frequency component and the second frequency component.

15. A power amplifying device comprising:
a first amplification circuit configured to amplify a first signal having a first frequency component and a second frequency component, and generate second harmonic components of the first frequency component and the second frequency component and third-order intermodulation distortion components of the first frequency component and the second frequency component;
a second amplification circuit configured to amplify a second signal received through an output node of the first amplification circuit;
a filter circuit connected between a ground node of the first amplification circuit and a common ground, and configured to pass the first frequency component and the second frequency component to the common ground; and
an inverting circuit connected to the output node of the first amplification circuit and the ground node, and configured to phase-invert a signal received from the ground node that includes second harmonic components of the first frequency component and the second frequency component.

16. The power amplifying device of claim 15, wherein the second signal received through the output node of the first amplification circuit comprises the second harmonic components of the first frequency component and the second frequency component, and the third-order intermodulation distortion components.

17. The power amplifying device of claim 16, wherein the inverting circuit receives second harmonic components and third-order intermodulation distortion components from the ground node of the first amplification circuit, and phase-inverts the received second harmonic components and third-order intermodulation distortion components.

18. The power amplifying device of claim 17, wherein the inverting circuit is configured to provide the phase-inverted second harmonic components and the phase-inverted third-order intermodulation distortion components to the output node of the first amplification circuit and attenuate the second harmonic components and the third-order intermodulation distortion components output through the output node of the first amplification circuit.

19. The power amplifying device of claim 15, wherein the filter circuit has a resonance frequency corresponding to any one frequency component of the second harmonic components of the first frequency component and the second frequency component.

20. The power amplifying device of claim 15, wherein the filter circuit has a resonance frequency corresponding to a frequency component between the second harmonic components of the first frequency component and the second frequency component.

21. The power amplifying device of claim 1, wherein the inverting circuit is further configured to provide the phase inverted signal directly to the output node of the first amplification circuit.

* * * * *